United States Patent
Ukai (10) Patent No.: US 8,045,030 B2
(45) Date of Patent: Oct. 25, 2011

(54) IMAGING DEVICE, AND CONTROL METHOD FOR SOLID IMAGING ELEMENT

(75) Inventor: Yusuke Ukai, Komaki (JP)

(73) Assignee: OMRON Automotive Electronics Co., Ltd., Achi (JP)

( * ) Notice: Subject to any disclaimer, the term of this patent is extended or adjusted under 35 U.S.C. 154(b) by 875 days.

(21) Appl. No.: 11/934,529

(22) Filed: Nov. 2, 2007

(65) Prior Publication Data

US 2008/0106627 A1   May 8, 2008

(30) Foreign Application Priority Data

Nov. 2, 2006 (JP) ................................. 2006-299053

(51) Int. Cl.
*H04N 5/335* (2011.01)
(52) U.S. Cl. ........................................ 348/308; 348/302
(58) Field of Classification Search .................. None
See application file for complete search history.

(56) References Cited

U.S. PATENT DOCUMENTS

| | | | | |
|---|---|---|---|---|
| 6,617,562 | B1 * | 9/2003 | Mann ........................... | 250/208.1 |
| 6,902,945 | B2 * | 6/2005 | Mann et al. ................. | 250/208.1 |
| 7,256,378 | B2 * | 8/2007 | Furukawa et al. .......... | 250/208.1 |
| 7,280,139 | B2 * | 10/2007 | Pahr et al. ................... | 348/241 |
| 7,381,936 | B2 * | 6/2008 | Tan et al. .................... | 250/208.1 |
| 2002/0085102 | A1 | 7/2002 | Takada | |
| 2004/0036787 | A1 * | 2/2004 | Barna ........................... | 348/308 |
| 2004/0069929 | A1 | 4/2004 | Furukawa et al. | |
| 2006/0006915 | A1 | 1/2006 | Yan et al. | |

FOREIGN PATENT DOCUMENTS

| | | |
|---|---|---|
| EP | 0739039 A2 | 10/1996 |
| EP | 1381223 A1 | 1/2004 |
| JP | 2002-290835 A | 10/2002 |

OTHER PUBLICATIONS

Tomokazu Kakumoto et al., "Development of Logarithmic Convention Type CMOS Image Sensor" Konica Minolta Technology Report, vol. 1, 2004 (p. 45-50), and English abstract thereof (1 page).
Japanese Office Action and English translation thereof, for Application No. 2006-299053, mailed on May 31, 2011 (4 pages).
Patent Abstracts of Japan, Publication No. 2002-290835, Publication Date Oct. 4, 2002 (1 page).
Extended European Search Report received in corresponding European application No. 07119525.9, dated Sep. 7, 2011.

* cited by examiner

*Primary Examiner* — Luong T Nguyen
(74) *Attorney, Agent, or Firm* — Osha • Liang LLP (57) ABSTRACT

An imaging device capable of suppressing the complexity of a constitution and reducing the dispersion of brightness sensitivities of individual solid imaging elements to the temperature includes a solid imaging element, a temperature sensor for detecting the temperature, and a temperature monitor for detecting the temperature of the solid imaging element with an output signal of the temperature sensor. On the basis of this detection result, the control values corresponding to the temperatures at different times are set in the register of the voltage control circuit. In accordance with the control values of the register, the voltage control circuit controls reset voltages to be fed to pixel cells.

6 Claims, 8 Drawing Sheets

IMAGING DEVICE, AND CONTROL METHOD FOR SOLID IMAGING ELEMENT

BACKGROUND OF THE INVENTION

1. Field of the Invention

The present invention relates to an imaging device and a control method for a solid imaging element.

2. Description of Related Art

In the related art, many CMOS image sensors (or CMOS type imaging elements) in solid imaging elements are used to acquire a variety of image data. Generally speaking, photographic devices of MOS type or the like are narrower in latitudes and dynamic ranges than the photographic negative films. In the case of the narrow latitudes and dynamic ranges, the color gradations are decreased such that the dark portions of an image are block pixels whereas the bright portions of the image are white pixels. A logarithmic compression type imaging device exists as a technique for increasing the color gradations.

Figure 7:
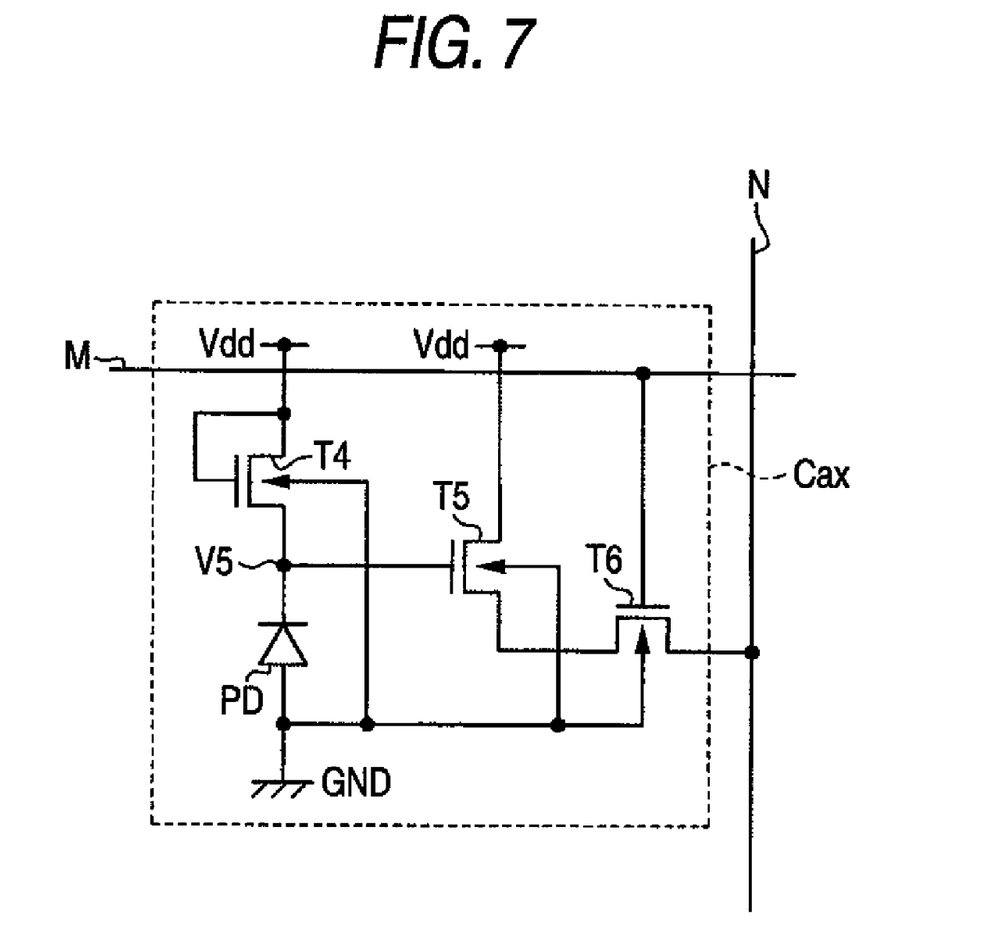
FIG. 7 is a circuit diagram of an imaging unit of the related art.

FIG. 7 shows a circuit diagram of a logarithmic compression type CMOS image sensor. A MOS transistor T4 has its drain and gate connected with each other, so that a photodiode PD is always supplied with a voltage from a voltage line connected with the drain of the MOS transistor T4. At this time, the MOS transistor T4 acts in a sub-threshold region, and the synthetic current of incident photocurrent and dark current, which is photoelectrically converted by the photodiode PD, flows as the drain current of the MOS transistor T4, so that the photodiode PD has its cathode voltage V5 determined by Formula (1) (the detail of which is referred to "Development of Logarithmic Conversion Type CMOS Image Sensor", KONIKA MINORUTA TECHNOLOGY REPORT vol. 1, 2004, p. 45-50 (Non-Patent Document 1)):

$$V5 = Vg - Vt - nKT/q \times \ln(IdL/WuCox) \quad \text{(Formula 1).}$$

The cathode voltage of the photodiode PD is connected with the gate of a MOS transistor T5, by which the signal is amplified. The amplified signal is outputted via a row signal line M through a MOS transistor T6 to a post circuit arranged in a matrix state.

The cathode voltage of the photodiode PD for a pixel signal sensitively responds to the drain current of the MOS transistor T4 (i.e., the current to flow through the photodiode PD). Since a temperature T is contained in Equation 1, the dark current component of the drain current changes with the temperature change, so that the ratio between the incident photocurrent and dark current seriously deteriorates.

Figure 8:
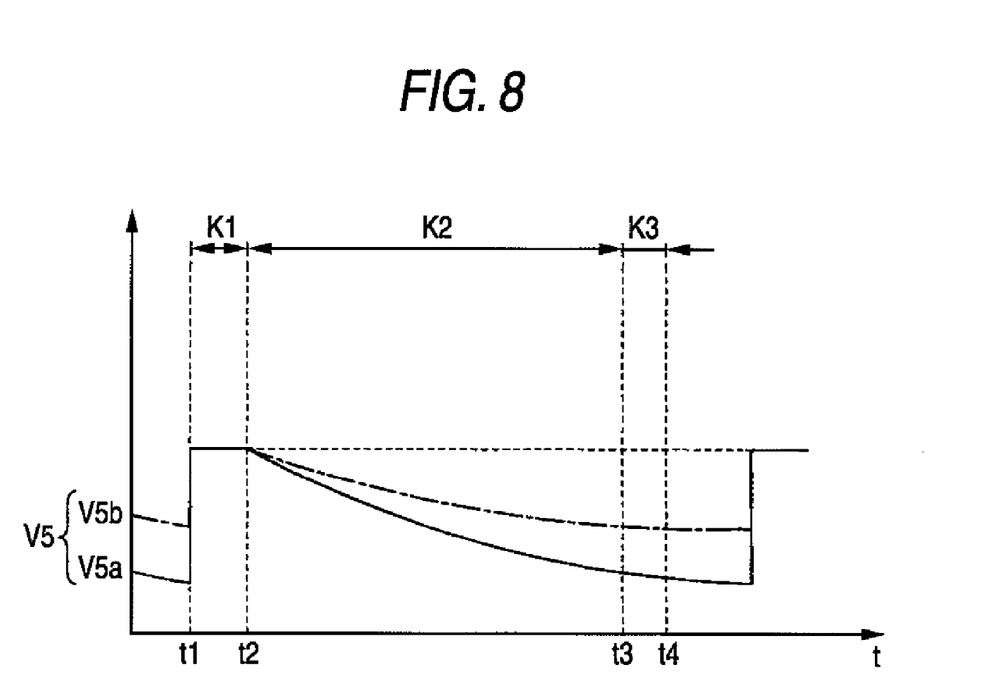
FIG. 8 is a characteristic diagram plotting the input/output signals of the imaging unit of the related art.

At a predetermined temperature, the cathode voltage V5 of the photodiode PD changes like a voltage V5a, as shown in FIG. 8. In case the temperature changes, on the other hand, the cathode voltage of the photodiode PD changes like a voltage V5b, as shown in FIG. 8. Even if the quantities of incident lights to a pixel are equal, for an exposure period K2 when the cathode voltage of the photodiode PD changes, the variations of the cathode voltage are different according to the peripheral temperature. As a result, the voltages for a read period K3 when the cathode voltage is substantially stable are different according to the peripheral temperature.

As this method for coping with the problem due to the temperature change, there has been proposed a method for correcting the A/D converted sensor signal outputted from an image sensor, according to the temperature of the image sensor (as referred to WO2002/045414 (Patent Document 1), for example).

If the constitution of Patent Document 1 is adopted, for example, it is necessary to correct the dispersion of the output characteristics in the image sensor, and to correct the offset of output signals. As a result, the constitutions for the individual corrections and the temperature corrections are needed to raise a problem that the circuit constitution is complicates.

SUMMARY OF THE INVENTION

This invention has an object to suppress the complexity of the constitution and to reduce the dispersion of brightness sensitivities of individual solid imaging elements to a temperature.

According to the invention, there is provided an imaging device comprising: a solid imaging element including an imaging unit having a plurality of pixel cells having light receiving elements and MOS type transistors connected in series for operating said MOS type transistors in a weak inversion state to convert the photo currents to flow through said light receiving elements in accordance with an incident light into a voltage, thereby to output said voltage, a reset voltage generating circuit for generating a reset voltage to initialize the output voltages of said light receiving elements, and decoders for feeding said reset voltage for a reset period to said pixel cells to initialize the output voltages of said light receiving elements, and for feeding drive voltages to operate said MOS type transistors for an exposure period in the weak inversion state to said pixel cells; and a temperature detecting unit for detecting the temperature of said solid imaging element. Said reset voltage generating circuit generates the reset voltages corresponding to the temperatures at different times, on the basis of the detection results of said temperature detecting unit. According to this constitution, the reset voltages are changed in response to the temperature changes, so that the photoelectric conversion signals little influenced by the temperature change, if any, can be obtained without providing the circuit constitution for correcting photoelectric conversion signals in response to the temperature changes.

In one mode of this invention, the imaging device further comprises: a table stored with a plurality of temperatures of said solid imaging element and control values corresponding to the individual temperatures; and a setting unit for reading the control values corresponding to the temperatures at the different times from said table, on the basis of the detection results of said temperature detecting unit thereby to set the read control values in said reset voltage generating circuit. Said reset voltage generating circuit generates the reset voltages in accordance with the control values set by said setting unit. With the table prestored with the control values, the constitution makes it possible to obtain the photoelectric conversion signals having little influences of the temperature change, from the control values of the reset voltages according to the temperature change.

In one mode of this invention, said setting unit stores the control values set in said reset voltage generating circuit, and compares said control values at every predetermined times with the control values read from said table in accordance with the detection results of said temperature detecting unit, thereby to set the control values read from said table in said reset voltage generating circuit, in case the difference between the two control values is at a predetermined value or more. Without any complicated operation being required, therefore, the pixels can be reset by generating the reset voltages according to the temperature.

In one mode of this invention, said decoders are connected with said pixel cells through row signal lines, drive signal lines and operation control lines, and said pixel cells include: first transistors having first terminals connected with said drive signal lines, second terminals connected with said light receiving elements, and gates connected with said operation control lines; second transistors having gates connected between said first transistors and said light receiving elements, first terminals connected with a high-potential power source, and second terminals connected with first terminals of third transistors; and said third transistors having second terminals connected with row data lines and gates connected with said row signal lines. Said decoders: feed the drive voltages and the reset voltages to said first transistors through said drive signal lines; feed voltages for a reset period through said operation control lines so as to turn ON said first transistors; feed the voltages for an exposure period so that said first transistors may operate in a weak inversion region; and apply voltages for a read period through said row signal lines so as to turn ON said third transistors. As a result, the drive voltage and the reset voltage can be switched through the drive signal line.

According to this invention, there is provided a control method for a solid imaging element including: an imaging unit having a plurality of pixel cells having light receiving elements and MOS type transistors connected in series for operating said MOS type transistors in a weak inversion state to convert the photo currents to flow through said light receiving elements in accordance with an incident light into a voltage, thereby to output said voltage; a reset voltage generating circuit for generating a reset voltage to initialize the output voltages of said light receiving elements; and decoders for feeding said reset voltage for a reset period to said pixel cells to initialize the output voltages of said light receiving elements, and for feeding drive voltages to operate said MOS type transistors for an exposure period in the weak inversion state to said pixel cells. The control method comprises a temperature detecting step of detecting the temperature of said solid imaging element, and said reset voltage generating circuit generates the reset voltages corresponding to the temperatures at different times, on the basis of the detection results of said temperature detecting step. Even in case the temperature change occurs, that step can easily correct the photoelectric conversion signals to be outputted from the pixel cells, with the control values stored in the table.

In one mode of this invention, the control method further comprises: a table stored with a plurality of temperatures of said solid imaging element and control values corresponding to the individual temperatures; and a setting step of reading the control values corresponding to the temperatures at the different times from said table, on the basis of the detection results of said temperature detecting step thereby to set the read control values in said reset voltage generating circuit. Said reset voltage generating circuit generates the reset voltages in accordance with the control values set by said setting step. With the table prestored with the control values, the constitution makes it possible to obtain the photoelectric conversion signals having little influences of the temperature change, from the control values of the reset voltages according to the temperature change.

In one mode of this invention, said setting step stores the control values set in said reset voltage generating circuit, and compares said control values at every predetermined times with the control values read from said table in accordance with said temperature detecting results, thereby to set the control values read from said table in said reset voltage generating circuit, in case the difference between the two control values is at a predetermined value or more. As a result, the operator adjusts the predetermined period and the predetermined value, and can make corrections on the change in the photoelectric conversion signals in case the temperature change occurs with a predetermined or more difference.

According to the invention, as has been described hereinbefore, the reset voltages are changed in response to the temperature changes, so that the photoelectric conversion signals little influenced by the temperature change, if any, can be obtained by providing not the circuit constitution for correcting the photoelectric conversion signals in response to the temperature changes but the simple circuit.

DESCRIPTION OF PREFERRED EMBODIMENTS

One embodiment of the present invention is described in the following with reference to FIG. 1 to FIG. 6B.

Figure 1:
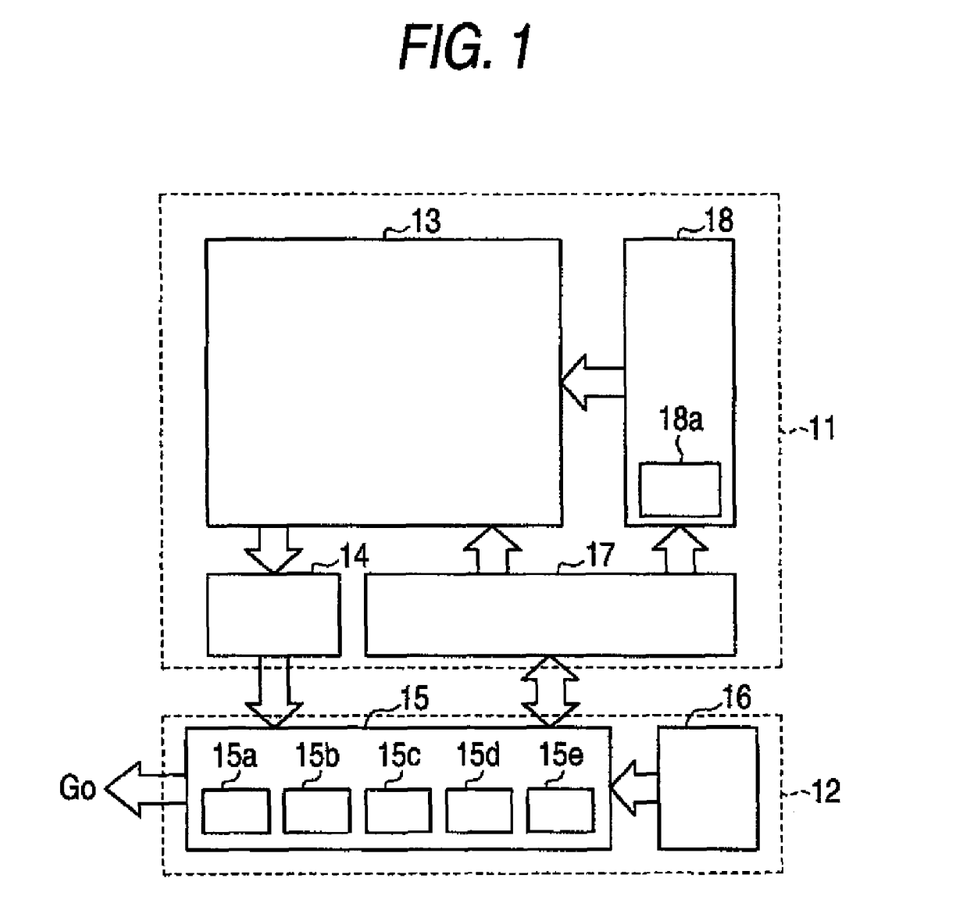
FIG. 1 is a block diagram showing an electric constitution of an imaging device of one embodiment.

As shown in FIG. 1, an imaging device comprises a solid imaging element 11 and a control circuit unit 12. The solid imaging element 11 includes an imaging unit 13, which has a plurality of pixels for converting an incidence light into electric signals so that the imaging unit 13 outputs the electric signals (or the sensor signals) generated at the individual pixels. An A/D converter 14 converts the sensor signals outputted from the imaging unit 13, into digital signals (or graphic data), thereby to output the graphic data to a control circuit 15 acting as a setting unit. With this control circuit 15, there is connected a temperature sensor 16, which detects the temperature of the solid imaging element 11, thereby to output a detection signal according to that temperature. A temperature monitor 15a acting as the temperature detecting unit of the control circuit 15 samples the detection signal of the temperature sensor 16 at a predetermined time interval (e.g., one second), thereby to generate a sampled digital value (or a temperature value). A table 15b of the control circuit 15 is prestored with a plurality of temperature values and control values corresponding to the individual temperature values. The control values corresponding to the individual temperature values are determined in experiments or the like by changing the temperature of the solid imaging element 11 and by changing reset signals to be fed to pixel cells Ca so that the output voltages at the individual temperatures may take equal values. The control values are stored in the table 15b. Moreover, the temperature monitor 15a reads the control values corresponding to the temperatures of the solid imaging element 11 in actions at different times, from the table 15b. Moreover, the temperature monitor 15a outputs setting commands containing the control values, through a serial interface circuit 17 to a voltage control circuit 18 acting as a reset voltage generating circuit.

The voltage control circuit 18 stores, when it inputs the setting commands, the register 18a with the control values contained in the setting commands. The voltage control circuit 18 feeds the individual pixels of the solid imaging element 11 with reset voltages corresponding to the control values stored in the register 18a. On the other hand, the control circuit 15 further includes a frame memory 15c, a noise eliminating unit 15d and an image processing unit 15e. The frame memory 15c stores the graphic data for one frame, which is outputted from the solid imaging element 11 and digitized by the A/D converter 14. The noise eliminating unit 15d calculates (e.g., subtracts) the graphic data stored in the frame memory 15c and correction data, thereby to eliminate fixed pattern noises. The image processing unit 15e performs a stretching processing (or a γ-correcting processing). The control circuit 15 outputs the graphic data processed, as a graphic signal Go.

Figure 2:
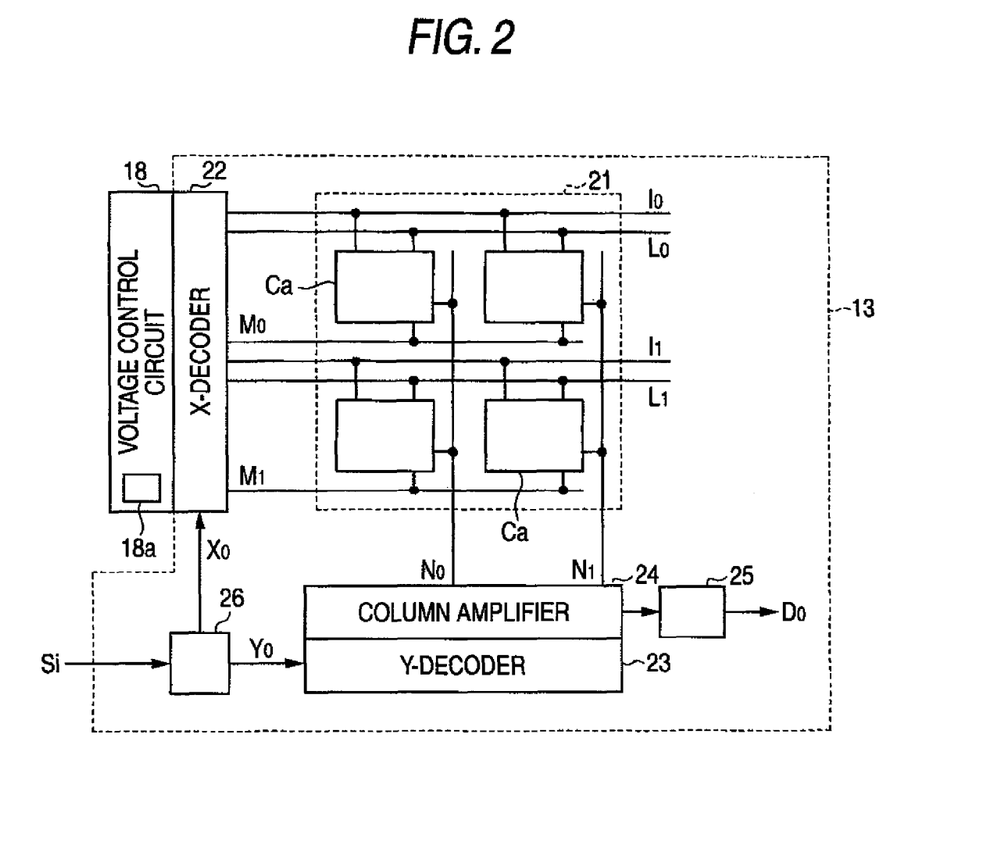
FIG. 2 is a block diagram showing an electric constitution of a solid imaging element.

FIG. 2 is a schematic block diagram of the imaging unit 13. The imaging unit 13 includes a pixel array 21, an X-decoder 22 and a Y-decoder 23 as address decoders, a column amplifier 24 as an amplifier, an output circuit 25, the voltage control circuit 18 and a serial-to-parallel converter 26. The pixel array 21 has a plurality of pixel cells Ca arrayed in a matrix. For simplified descriptions, the present embodiment is explained on the pixel array 21 having the pixel cells Ca corresponding to the pixels of FIG. 1, which are arrayed in the shape of a matrix with two rows and two columns. Each pixel cell Ca detects the electric current to flow through a light receiving element, thereby to convert it into an electric signal. The pixel cells Ca of each row are individually connected with row signal lines $M_0$ and $M_1$, and the pixel cells Ca of each column are individually connected with column data lines $N_0$ and $N_1$.

A serially converted address signal Si is inputted to the serial-to-parallel converter 26. This serial-to-parallel converter 26 converts the address signal Si in parallel thereby to generate row address signals and column address signals of a bit number corresponding to the row-column number of the pixel array 21, and outputs the row address signal to the X-decoder 22 and the column address signal to the Y-decoder 23. Here in this embodiment, the pixel array 21 has the pixel cells Ca with two rows and two columns, so that the serial-to-parallel converter 26 generates a row address signal $X_0$ and a column address signal $Y_0$ of each one bit.

With the X-decoder 22, there are connected the two tow signal lines $M_0$ and $M_1$, two drive signal lines $I_0$ and $I_1$ and two operation control lines $L_0$ and $L_1$, which correspond to the row number of the pixel array 21. With the X-decoder 22, there is connected the voltage control circuit 18. This voltage control circuit 18 generates the various voltages necessary for outputting the electric signals from the pixel cells Ca (e.g., driving voltages for driving the pixel cells Ca, operating voltages for operating the pixel cells Ca, and selecting voltages for reading electric signals from the pixel cells Ca), and feed them to the X-decoder 22. Moreover, the voltage control circuit 18 controls the drive voltages (or the reset voltages) to be fed to the individual pixels for a reset period to initialize the pixel cells Ca, in accordance with the control values stored in the register 18a.

In response to the row address signal $X_0$, the X-decoder 22 selects the row signal line, the drive signal line and the operation control line, which are connected with the pixel cells Ca of each row. For example, the X-decoder 22 selects the row signal line $M_0$, the drive signal line $I_0$ and the operation control line $L_0$, in case the row address signal $X_0$ is "0", and selects the row signal line $M_1$, the drive signal line $I_1$ and the operation control line $L_1$, in case the row address signal $X_0$ is "1". Moreover, the X-decoder 22 feeds the pixel cells Ca with the various voltages through the selected wiring line in accordance with the timing, at which the pixel cells Ca are driven. In this embodiment, the X-decoder 22 feeds the pixel cells Ca through one selected row signal line with a reading voltage for reading out graphic information.

Moreover, the X-decoder 22 feeds the pixel cells Ca with the drive voltages or the reset voltages through the selected drive signal line. Further, the X-decoder 22 feeds the pixel cells Ca with the control voltages through the selected operation control line. Thus in this embodiment, the two pixel cells Ca connected with the same row signal line are fed through the one selected row signal line with a voltage as a reading signal for reading the image information. Each pixel cell Ca acts in response to the voltage fed through each signal line.

The reset voltages to be fed to the pixel cells Ca correspond to the control values stored in the register 18a of the voltage control circuit 18, and the control values corresponding to the temperatures of the solid imaging element 11. As a result, the individual pixel cells Ca are fed with the reset voltages corresponding to the temperatures of the solid imaging element 11.

Photoelectric conversion signals, which are read as the graphic information from the two pixel cells Ca, are inputted to the column amplifier 24 through the column data lines $N_0$ and $N_1$ connecting each pixel cell Ca. The column amplifier 24 is connected with the Y-decoder 23, to which is inputted the column address signal $Y_0$ corresponding to the column number of the pixel array 21. After this, the Y-decoder 23 outputs the signal, which is decoded from the column address signal $Y_0$, to the column amplifier 24.

The column amplifier 24 includes amplifying units, a multiplexer circuit unit and an analog/digital (A/D) conversion unit, and the amplifying units are disposed to correspond to the individual column data lines $N_0$ and $N_1$. The photoelectric conversion signals, which are inputted through the individual column data lines $N_0$ and $N_1$, are individually amplified at the individual amplifying units, and are transmitted to the A/D conversion unit through the multiplexer circuit unit. The A/D conversion unit samples the output signal of the corresponding amplifying unit on the basis of a predetermined clock signal, and converts an analog quantity (e.g., a voltage) sampled, into a digital signal. Thus, the column amplifier 24 generates the two digital signals corresponding to the photoelectric conversion signals, which are individually read out from the two pixel cells Ca connected with the individual row signal lines $M_0$ and $M_1$. On the basis of the output signal of the Y-decoder 23, the column amplifier 24 selects such one of the two digital signals as corresponds to the logical level of the column address signal $Y_0$, and outputs that digital signal to the output circuit 25. This output circuit 25 converts the output signal of the column amplifier 24 thereby to output an output signal Do.

As has been described hereinbefore, the solid imaging element 11 includes a plurality of pixel cells Ca arrayed in the matrix shape, and selects one pixel cell Ca decided with the row address signal $X_0$ and the column address signal $Y_0$. Moreover, the solid imaging element 11 outputs the graphic information of one selected pixel cell Ca, that is, the photoelectric conversion signal corresponding to the quantity of incident light generated by the photoelectric conversion, as the output signal Do. With the row address signal $X_0$ and the column address signal $Y_0$, therefore, it is possible to read the graphic information of the pixel cell Ca at an arbitrary position.

The pixel cells Ca of each column constituting the aforementioned solid imaging element 11 are individually connected with the operation control lines $L_0$ and $L_1$, and these operation control lines $L_0$ and $L_1$ are individually connected with the voltage control circuit 18.

Figure 3:
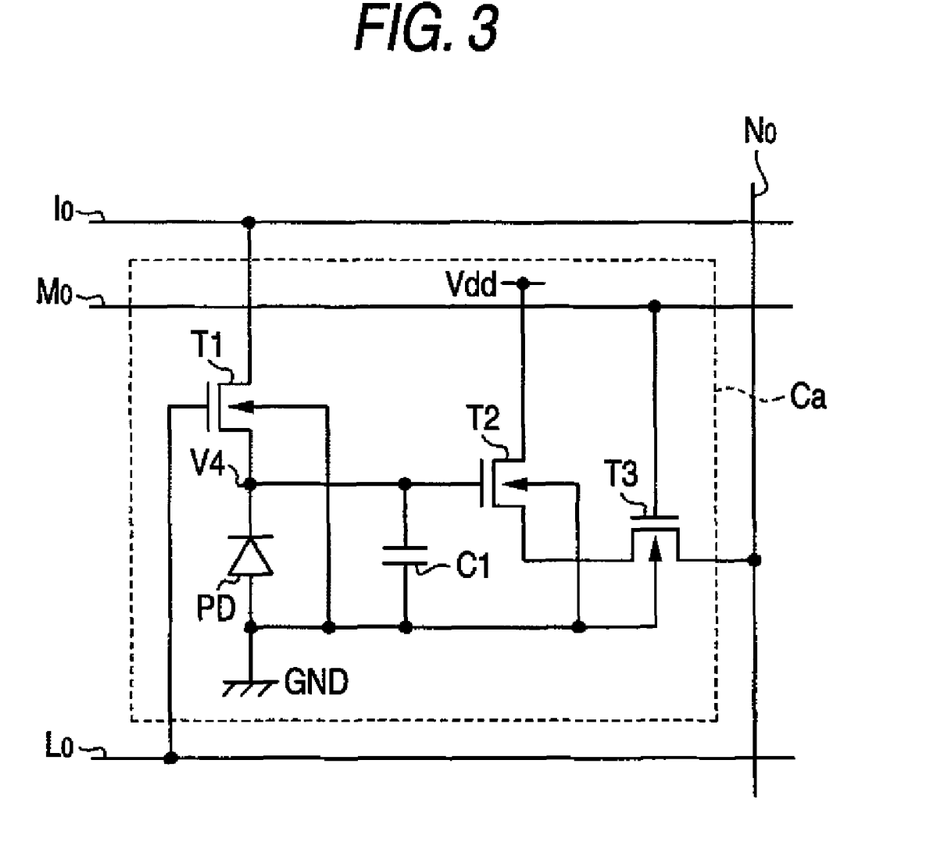
FIG. 3 is a circuit diagram showing an imaging unit of the solid imaging element.

Next, the configuration of the pixel cell Ca is explained. Since the individual pixel cells Ca have an identical constitution, here is enumerated and explained the pixel cell Ca, which is connected with the row signal line $M_0$ and the column data line $N_0$.

FIG. 3 shows the pixel cell Ca of this embodiment. The pixel cell Ca is constituted of a photodiode PD acting as a light receiving element, and three MOS transistors T1, T2 and T3. The first to third MOS transistors T1 to T3 of N-channel type MOS transistors of first conduction channel type transistors having back gates individually connected with the ground GND.

The first transistor T1 as a load transistor has its drain (or a first terminal) connected with the drive signal line $I_0$, its gate (or a control terminal) connected with the operation control line $L_0$, and its source (or a second terminal) connected with the cathode of the photodiode PD. The anode of the photodiode PD is connected with a low-potential power source (or the ground GND in this embodiment). An electric current according to the quantity of incident light flows through the photodiode PD so that a node voltage V4 is applied to the photodiode PD. Moreover, a parasitic capacity C1 is connected in parallel with the PD.

A node at an intermediate point between the first transistor T1 and the photodiode PD is connected with the gate of the second transistor T2 acting as an amplifying transistor. The second transistor T2 has its drain fed with a high-potential power source Vdd and its source connected with the first terminal (or the drain in this embodiment) of the third transistor T3 acting as a pixel selecting transistor. The third transistor T3 has its gate connected with the row signal line $M_0$ and its second terminal (or a source in this case) with the column data line $N_0$. The third transistor T3 is turned ON/OFF in response to the reading signal fed through the row signal line $M_0$, so that the second transistor T2 and the column data line $N_0$. With the column data line $N_0$, there is connected the not-shown constant current source, which constitutes a source follower circuit together with the second transistor T2, and the node voltage V4 is outputted as the photoelectric conversion signal through the second transistor T2 to the column data line $N_0$.

Here are described controls on the pixel cell Ca thus constituted.

A predetermined voltage is applied to the photodiode PD of the pixel cell Ca for a constant period. This voltage application is performed to initialize the pixel cell Ca, that is, to initialize the output voltage of the photodiode PD thereby to prevent any afterimage. This voltage to be applied to the photodiode PD is called the reset voltage, and the period for applying the reset voltage is called the reset period.

When the pixel cell Ca is illuminated with a light, a subthreshold current (or Subthreshold Current) of a quantity equal to the photo current flowing through the photodiode PD flows to the first transistor T1 in accordance with the quantity of that light, and the output voltage of the photodiode PD changes from the reset voltage, so that the node voltage V4 becomes stable (i.e., an electric balance state) at the potential according to the quantity of the incident light. At this time, the first transistor T1 acts in a weak reversion zone so that the node voltage V4 takes the potential, which is logarithmically converted from the photo current. By turning ON the third transistor T3 with the reading signals (e.g., the signals from the row signal lines $M_0$ and $M_1$), moreover, the photoelectric conversion signal at the potential corresponding to the node voltage V4, i.e., the quantity of the incident light is outputted to the column data line $N_0$.

The X-decoder 22 changes, when it reads the signal, a voltage V1 to be applied to the row signal lines $M_0$ and $M_1$, for example, to an H level, and returns the same to an L level when the reading ends.

Figure 5:
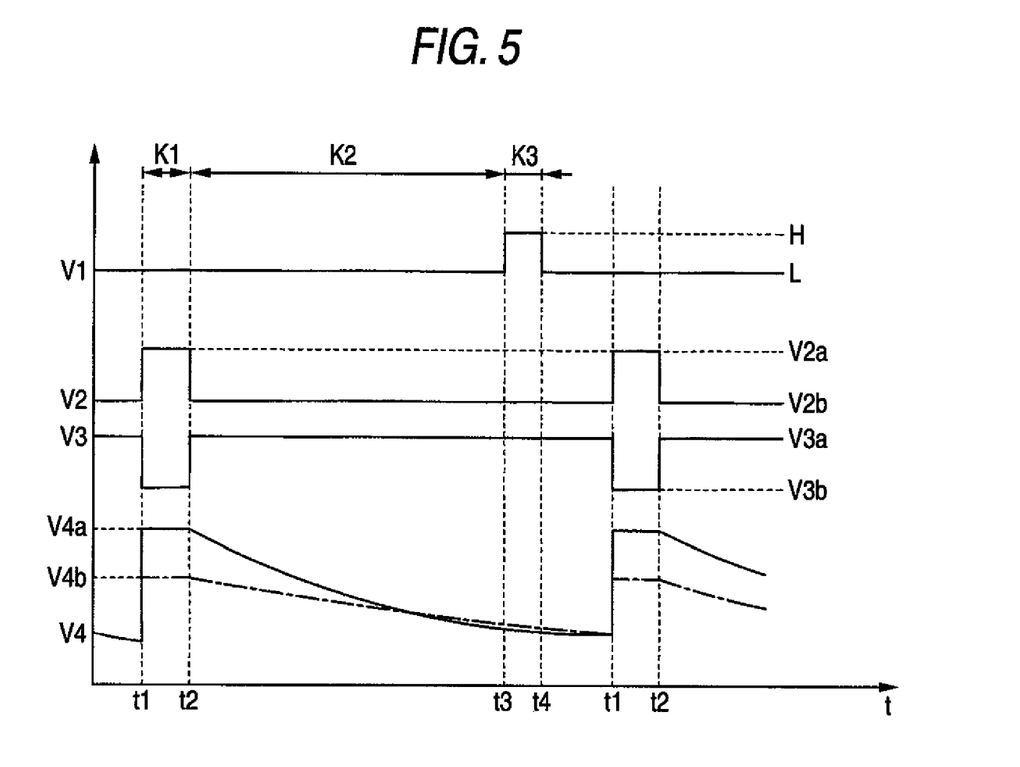
FIG. 5 is a characteristic diagram showing input/output signals of the imaging unit.

For a reset period K1 from a time t1 to a time t2, as shown in FIG. 5, the X-decoder 22 applies a voltage V2 generated at the voltage control circuit 18, at a level of a potential V2a to the drive signal line $I_0$, and applies a voltage V3 at the level of a potential V3b to the operation control line $L_0$. Then, for the reset period K1, the node voltage V4 of the photoelectric conversion signal to be outputted from the pixel cell Ca is reset to a potential V4a, and is prepared for a next exposure period K2.

Next, for a exposure period K2 from the time t2 to a time t3, the X-decoder 22 applies a potential V2b generated at the voltage control circuit 18, to the drive signal line $I_0$, and applies a potential V3a to the operation control line $L_0$. At this time, as described above, the node voltage V4 of the photoelectric conversion signal outputted from the pixel cell transits from the reset voltage to and becomes stable at the potential according to the photo current established according to the incident light.

Next, for a read period K3 from the time t3 to a time t4, when the temperature difference of the imaging unit changes to a predetermined value (e.g., ±1 degree) or more, the voltage control circuit 18 generates, on the basis of the measured value of the temperature sensor 16, the reset voltage (although not shown) corresponding to the temperature at that time. For the read period K3, the X-decoder applies that reset voltage to the IO so that the node voltage V4 of the photoelectric conversion signal outputted from the pixel cell Ca is reset to a potential V4b.

In case the temperature change occurs, for the exposure period K2, the node voltage V4 changes, as indicated by a single-dotted line in FIG. 5, according to that temperature. Here, the quantity of light at this time is equal to that at the time when the node voltage V4 of the photoelectric conversion signal outputted from the pixel cell Ca is reset to the potential V4a. At this time, as described above, the node voltage V4 of the photoelectric conversion signal outputted from the pixel cell transits from the reset voltage to and becomes stable at the potential according to the photo current established according to the incident light. At this time, the photoelectric conversion signal little influenced by the temperature change can be attained for the read period K3.

Next, a method for setting the control values on the temperature changes is described with reference to FIG. 4.

Figure 4:
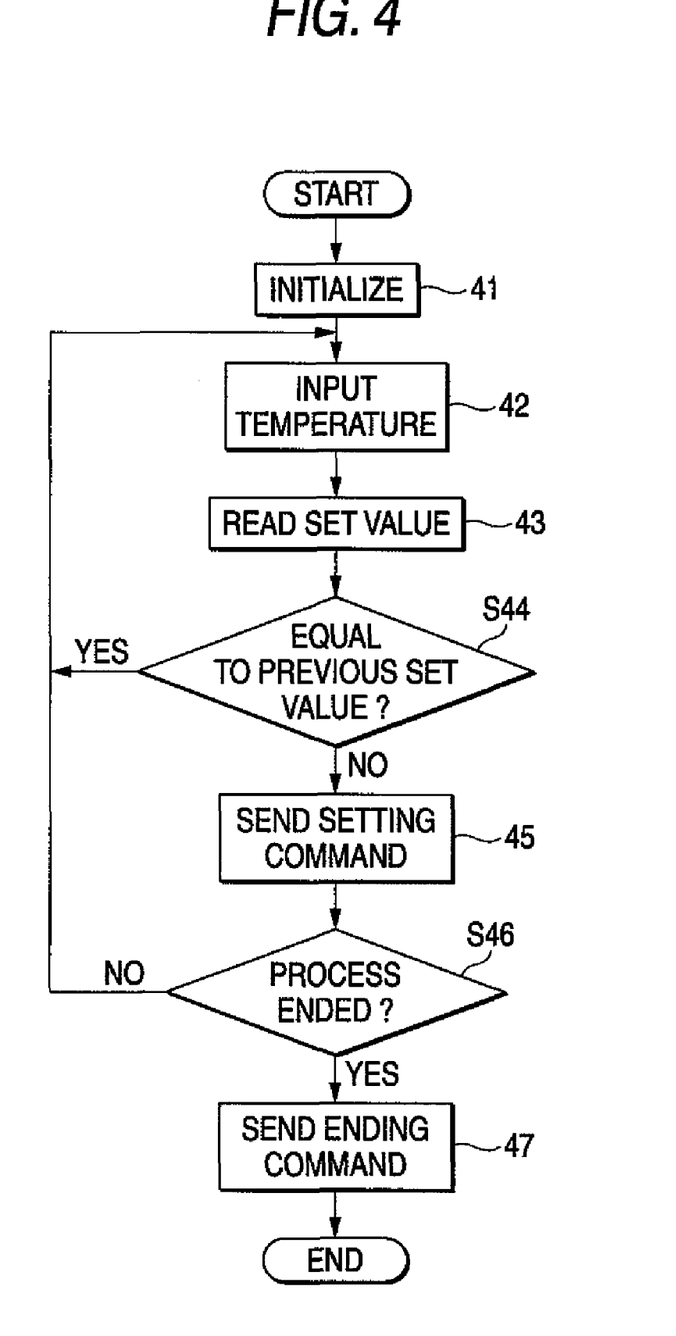
FIG. 4 is a flow chart showing a control method of the solid imaging element.

At Step 41 of FIG. 4, the control circuit 15 sends a command containing an initial value, and causes the register 18a assembled in the voltage control circuit 18, to store the initial (default) value of the control value contained in an initializing command. When the temperature monitor 15a catches the temperature sensed by the temperature sensor 16, at a predetermined timing, the temperature at each timing is inputted (at Step 42 as a temperature detecting step) as a new temperature to the control circuit 15. In response to the newly set temperature, the initial value is read (at Step 43) from the table 15b in the control circuit 15, and it decided (at Step 44) whether or not it is equal to the previous control value read from the not-shown storage unit (or the register). If the control value is equal or within a predetermined range, it is deemed that no temperature change has occurred, and the voltage is not changed to await the predetermined timing of Step 42. If the control value is outside the predetermined range, on the other hand, it is deemed that a temperature change has occurred, and the setting command to change the voltage set in the register 18a into the control value corresponding to the temperature written in the table 15b of the control circuit 15 is sent (at Step 45 as the setting step). At this step, moreover, the control value is stored in the not-shown storage unit.

In case the instruction to end the control itself is fed (at Step 46) through the control circuit 15, the ending command is sent (at Step 47) to the register if ended, but the operation is repeated, if not, to the state, in which the predetermined timing of Step 42 is awaited.

Figure 6A:
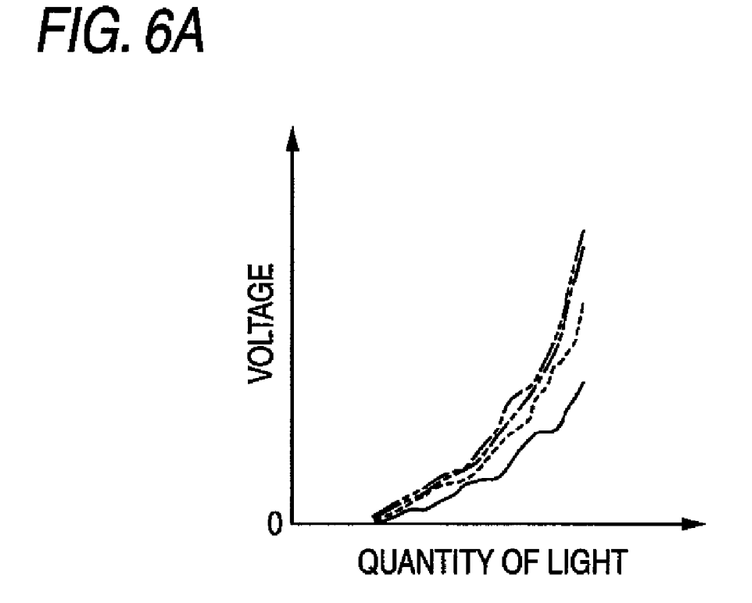
FIGS. 6A and 6B are characteristic diagrams plotting the output signals of the imaging unit against temperature changes.
Figure 6B:
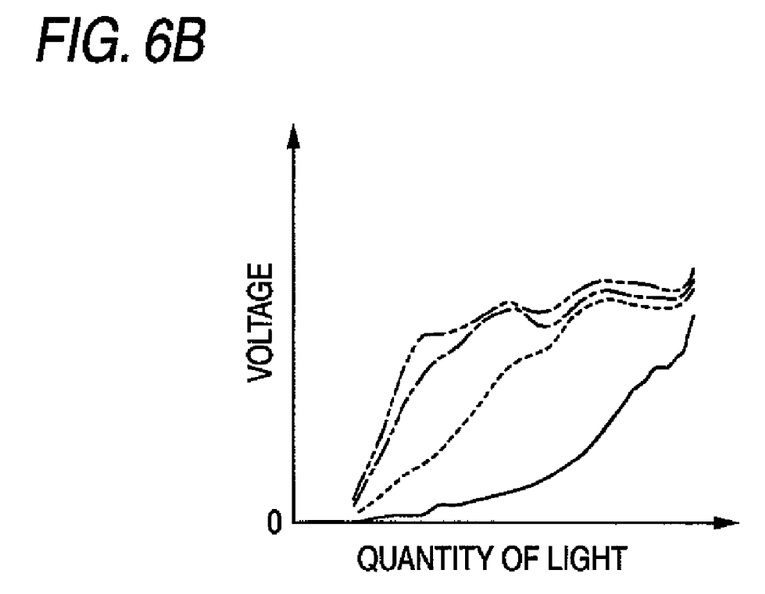

FIGS. 6A and 6B are characteristic diagrams plotting the changes of the output voltage against the changes in the quantity of light for every temperatures (80 degrees, 40 degrees, 0 degrees and −40 degrees). Here in FIGS. 6A and 6B, the temperatures of 80 degrees, 40 degrees, 0 degrees and −40 degrees are indicated by a solid line, a broken line, a single-dotted line and a double-dotted line, respectively. FIG. 6A plots the change in the output voltage at the time when the reset voltage to be fed to each pixel cell Ca is controlled in this embodiment in accordance with the temperature of the solid imaging element 11, and FIG. 6B plots the change in the output voltage of the example of the related art, in which the reset voltage is not controlled. In this embodiment, the fluctuations of the output voltage against the temperature change can be suppressed, as apparent from FIGS. 6A and 6B.

As has been detailed hereinbefore, the following effects can be attained according to this embodiment.

(1) The imaging device comprises the solid imaging element 11, the temperature sensor 16 for detecting the temperature, and the temperature monitor 15a for detecting the temperature of the solid imaging element 11 with the output signal of the temperature sensor 16. On the basis of this detection result, moreover, the control values corresponding to the temperatures at the different times are set in the register 18a of the voltage control circuit 18. In response to the control values of the register 18a, the voltage control circuit 18 controls the reset signals to be fed to the pixel cells Ca. According to this constitution, the reset voltages are changed in response to the temperature changes, so that the photoelectric conversion signals little influenced by the temperature change, if any, can be obtained without providing the circuit constitution for correcting the photoelectric conversion signals in response to the temperature changes.

(2) The control circuit 15 stores the control values set in the register 18a of the voltage control circuit 18, and compares those control values at every predetermined times with the control values which are read from the table 15b in accordance with the detection results. In case the differences between those two control values are at a predetermined value or more, the register 18a of the voltage control circuit 18 is set with the control values read from the table 15b. Without any complicated operation being required, therefore, the pixels can be reset by generating the reset voltages according to the temperature.

(3) The X-decoder 22 is connected with the pixel cells Ca through the row signal line (e.g., $M_O$), the drive signal line ($I_O$) and the operation control line ($L_O$). The pixel cell Ca has the first transistor T1, which has its first terminal connected with the drive signal line ($I_O$), its second terminal connected with the photodiode PD and its gate connected with the operation control line ($L_O$). The pixel cell Ca includes the second transistor T2, which has its gate connected between the first transistor T1 and the photodiode PD, its first terminal connected with the high-potential power source Vdd and its second terminal connected with the first terminal of the third transistor T3, and the third transistor T3, which has its second terminal and its gate connected with the column data line ($N_O$) and the row signal line ($M_O$), respectively. The X-decoder 22 feeds the first transistor T1 with the drive voltage and the reset voltage through the drive signal line ($I_O$), and applies the voltage to turn ON the first transistor T1 for the reset period K1 through the operation control line ($L_O$). Moreover, the X-decoder 22 applies the voltage for the exposure period K2 so that the first transistor T1 may operate in the weak reversion region, and the voltage for the read period K3 through the row signal line ($M_O$) so that the third transistor T3 may be turned ON. As a result, the drive voltage and the reset voltage can be switched through the drive signal line ($I_O$) so that the photoelectric conversion and the reset can be ensured to correct the temperature.

Incidentally, the aforementioned individual embodiments may also be practiced in the following modes.

The imaging unit uses the pixels with two rows and two columns but may also have pixels with four rows and four columns and pixels with five rows and five columns. Moreover, the imaging unit may also have different row and column numbers.

The operation control signals may also be constituted of a plurality of bits or a plurality of signals, and may control the drive voltages on the basis of the combinations of the logical levels of the bits or signals.

The arrangements of the X-decoder, the Y-decoder and the control signal lines may be mutually interchanged by considering the connections.

The catch of the temperature change need not be timed after the specified values were read from the tables but may be made by comparing the temperatures when inputted.

The signals at the individual portions are described by dividing the potentials of the signals, to which the voltage control circuit 18 responds, into the H level (or the high potential) and the L level (or the low potential), either of which may also be used as the reference level.

Not by reading the specified values from the tables but by utilizing the control values stored in the tables, the values calculated from the detected temperature values may also be used as the control values.

For example, the control value at one temperature is stored in the tables so that the control value corresponding to the detected temperature may be determined by calculating the read control value. Moreover, the tables are stored with the control values corresponding to a plurality of temperatures (e.g., 80 degrees, 40 degrees, 0 degrees and −40 degrees), so that the control values corresponding to the detected temperatures may also be determined by interpolations (e.g., linear interpolations) from the control values stored in the tables.

The control values determined not by reading the specified values from the tables but by calculating them directly from the temperature values (i.e., the calculations using quadratic equations).

What is claimed is:
1. An imaging device comprising:
a solid element including
an imaging unit having a plurality of pixel cells having light receiving elements and MOS type transistors connected in series for operating said MOS type transistors in a weak inversion state to convert photo currents to flow through said light receiving elements in accordance with an incident light into voltages, thereby to output said voltages, a reset voltage generating circuit for generating reset voltages to initialize the output voltages of said light receiving elements, and decoders for feeding said reset voltages for a reset period to said plurality of pixel cells to initialize the output voltages of said light receiving elements, and for feeding drive voltages to operate said MOS type transistors for an exposure period in the weak inversion state to said plurality of pixel cells; and a temperature detecting unit for detecting a temperature of said solid imaging element, wherein said reset voltage generating circuit generates the reset voltages corresponding to the temperature at different times, on the basis of the detection results of said temperature detecting unit;

a table stored with a plurality of temperatures of said solid imaging element and control values corresponding to individual temperatures; and a setting unit for reading the control values corresponding to the temperatures at the different times from said table, on the basis of the detection results of said temperature detecting unit thereby to set the read control values in said reset voltage generating circuit, wherein said reset voltage generating circuit generates the reset voltages in accordance with the control values set by said setting unit.

2. An imaging device as set forth in claim 1, wherein said setting unit stores the control values set in said reset voltage generating circuit, and compares said control values at every predetermined times with the control values read from said table in accordance with the detection results of said temperature detecting unit, thereby to set the control values read from said table in said reset voltage generating circuit, in case the difference between the two control values is at a predetermined value or more.

3. A control method for a solid imaging element, comprising:

an imaging unit having a plurality of pixel cells having light receiving elements and MOS type transistors connected in series for operating said MOS type transistors in a weak inversion state to convert photo currents to flow through said light receiving elements in accordance with an incident light into a voltage, thereby to output said voltage;

a reset voltage generating circuit for generating reset voltages to initialize the output voltages of said light receiving elements; and decoders for feeding said reset voltages for a reset period to said plurality of pixel cells to initialize the output voltages of said light receiving elements, and for feeding drive voltages to operate said MOS type transistors for an exposure period in the weak inversion state to said plurality of pixel cells, comprising a temperature detecting step of detecting, the temperature of said solid imaging element, wherein said reset voltage generating circuit generates the reset voltages corresponding to the temperatures at different times, on the basis of the detection results of said temperature detecting step;

a table stored with a plurality of temperatures of said solid imaging element and control values corresponding to individual temperatures; and a setting step of reading the control values corresponding to the temperatures at the different times from said table, on the basis of the detection results of said temperature detecting step thereby to set the read control values in said reset voltage generating circuit, wherein said reset voltage generating circuit generates the reset voltages in accordance with the control values set by said setting step.

4. A control method for a solid imaging element as set forth in claim 3, wherein said setting step stores the control values set in said reset voltage generating circuit, and compares said control values at every predetermined times with the control values read from said table in accordance with said temperature detection results, thereby to set the control values read from said table in said reset voltage generating circuit, in case the difference between the two control values is at a predetermined value or more.

5. An imaging device as set forth in claim 1, wherein:

said decoders are connected with said plurality of pixel cells through row signal lines, drive signal lines and operation control lines;

said plurality of pixel cells include:

first transistors having first terminals connected with said drive signal lines, second terminals connected with said light receiving elements, and gates connected with said operation control lines;

second transistors having gates connected between said first transistors and said light receiving elements, first terminals connected with a high-potential power source, and second terminals connected with first terminals of third transistors; and said third transistors having second terminals connected with row data lines and gates connected with said row signal lines;

wherein said decoders:

feed the drive voltages and the reset voltages to said first transistors through said drive signal lines;

feed voltages for a reset period through said operation control lines so as to turn ON said first transistors;

feed the voltages for an exposure period so that said first transistors may operate in a weak inversion region; and apply voltages for a read period through said row signal lines so as to turn ON said third transistors.

6. An imaging device as set forth in claim 2, wherein:

said decoders are connected with said plurality of pixel cells through row signal lines, drive signal lines and operation control lines;

said plurality of pixel cells include:

first transistors having first terminals connected with said drive signal lines, second terminals connected with said light receiving elements, and gates connected with said operation control lines;

second transistors having gates connected between said first transistors and said light receiving elements, first terminals connected with a high-potential power source, and second terminals connected with first terminals of third transistors; and said third transistors having second terminals connected with row data lines and gates connected with said row signal lines;

wherein said decoders:

feed the drive voltages and the reset voltages to said first transistors through said drive signal lines;

feed voltages for a reset period through said operation control lines so as to turn ON said first transistors;

feed the voltages for an exposure period so that said first transistors may operate in a weak inversion region; and apply voltages for a read period through said row signal lines so as to turn ON said third transistors.

* * * * *